(12) United States Patent
Björbell

(10) Patent No.: US 7,485,489 B2
(45) Date of Patent: Feb. 3, 2009

(54) ELECTRONICS CIRCUIT MANUFACTURE

(76) Inventor: Sten Björbell, Sleaveen, Macroom, County Cork (IE)

( * ) Notice: Subject to any disclaimer, the term of this patent is extended or adjusted under 35 U.S.C. 154(b) by 324 days.

(21) Appl. No.: 11/012,196

(22) Filed: Dec. 16, 2004

(65) Prior Publication Data

US 2005/0112798 A1    May 26, 2005

Related U.S. Application Data

(63) Continuation of application No. PCT/IE03/00094, filed on Jun. 19, 2003.

(30) Foreign Application Priority Data

| Jun. 19, 2002 | (IE) | ................................. | 2002/0503 |
| Jul. 22, 2002 | (IE) | ................................. | 2002/0609 |

(51) Int. Cl.
  *H01L 21/66* (2006.01)
  *H01L 21/00* (2006.01)
  *H01L 23/29* (2006.01)
  *H05K 1/18* (2006.01)

(52) U.S. Cl. ............................ 438/106; 438/15; 438/25; 438/26; 438/51; 438/55; 438/64; 361/761; 257/790; 257/791; 257/792; 257/793; 257/794; 257/795

(58) Field of Classification Search ................. None
  See application file for complete search history.

(56) References Cited

U.S. PATENT DOCUMENTS

| 4,783,695 | A | 11/1988 | Eichelberger | ................. | 357/65 |
| 5,048,179 | A | 9/1991 | Shindo et al. | ................. | 29/840 |
| 5,564,181 | A | 10/1996 | Dineen et al. | ................. | 29/841 |
| 6,309,912 | B1 | 10/2001 | Chiou et al. | ................. | 438/118 |
| 6,344,688 | B1 | 2/2002 | Wang | ........................ | 257/724 |
| 6,359,235 | B1 * | 3/2002 | Hayashi | ..................... | 174/260 |
| 6,400,573 | B1 | 6/2002 | Mowatt et al. | ............... | 361/719 |
| 6,403,881 | B1 | 6/2002 | Hughes | ....................... | 174/52 |
| 6,625,037 | B2 * | 9/2003 | Nakatani et al. | ............ | 361/762 |

(Continued)

FOREIGN PATENT DOCUMENTS

EP    1111674 A2    6/2001

(Continued)

OTHER PUBLICATIONS

Ostmann et al, Advancing Microelectronics May/Jun. 2002, pp. 13-15, Chip in Polymer—the Next Step in Miniaturization.
Braunisch et al, Elec Comp & Tech Conf, 2002, 6 pgs., Electrical Performance of Bumpless Build-Up Layer Packaging.

*Primary Examiner*—Zandra Smith
*Assistant Examiner*—James M Mitchell
(74) *Attorney, Agent, or Firm*—Jacobson Holman PLLC

(57) ABSTRACT

A circuit with embedding components (13) is produced by placing the components (13) on a substrate (14) and applying sheets (15) of prepreg. The prepreg sheets (15) have apertures to accommodate the -components, the number of sheets and arrangement of apertures being chosen to accommodate a variety of component X, Y and Z dimensions. A top layer with Cu foil (16(*b*)) is applied. The assembly is pressed in an operation analogous to conventional multilayer board lamination pressing. This causes all of the prepreg resin to flow to completely embed the components without raids or damage. Electrical connections are made by drilling and plating vias.

39 Claims, 4 Drawing Sheets

U.S. PATENT DOCUMENTS

| | | | |
|---|---|---|---|
| 6,724,638 B1 * | 4/2004 | Inagaki et al. | 361/763 |
| 6,768,193 B2 * | 7/2004 | Nakamura et al. | 257/707 |
| 6,784,530 B2 * | 8/2004 | Sugaya et al. | 257/686 |
| 6,955,948 B2 * | 10/2005 | Asahi et al. | 438/125 |
| 6,964,887 B2 * | 11/2005 | Akagawa | 438/126 |
| 7,018,866 B2 * | 3/2006 | Sugaya et al. | 438/108 |
| 7,112,469 B2 * | 9/2006 | Mihara | 438/110 |
| 7,248,482 B2 * | 7/2007 | Asahi et al. | 361/790 |
| 2002/0117743 A1 * | 8/2002 | Nakatani et al. | 257/687 |
| 2002/0137263 A1 | 9/2002 | Towle et al. | 438/127 |
| 2003/0062618 A1 * | 4/2003 | Xie et al. | 257/712 |
| 2003/0090083 A1 * | 5/2003 | Williams | 280/460.1 |
| 2005/0064704 A1 * | 3/2005 | Shizuno | 438/637 |
| 2005/0156322 A1 * | 7/2005 | Smith et al. | 257/778 |

FOREIGN PATENT DOCUMENTS

| | | |
|---|---|---|
| EP | 0611129 B1 | 6/2002 |
| EP | 1259103 A1 | 11/2002 |
| EP | 1321980 A1 | 6/2003 |
| JP | 0624772651 | 5/1996 |
| WO | WO02/33751 | 4/2002 |

* cited by examiner

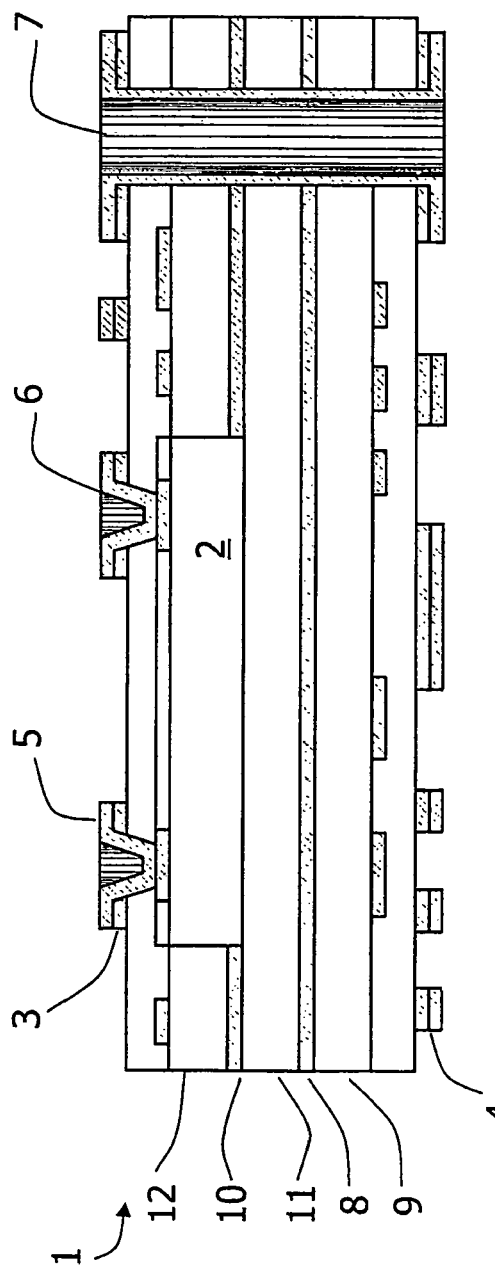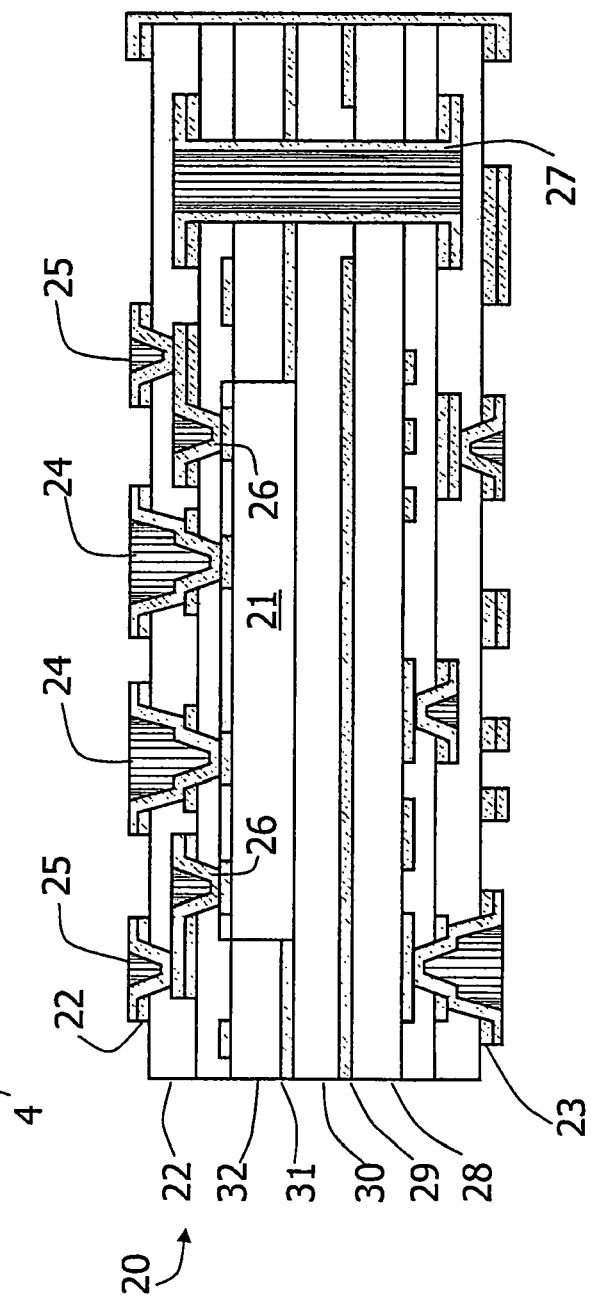

Place dies on substrate

Place prepreg sheets

Place top external sheets & "laminate"

Drill vias & electroplate

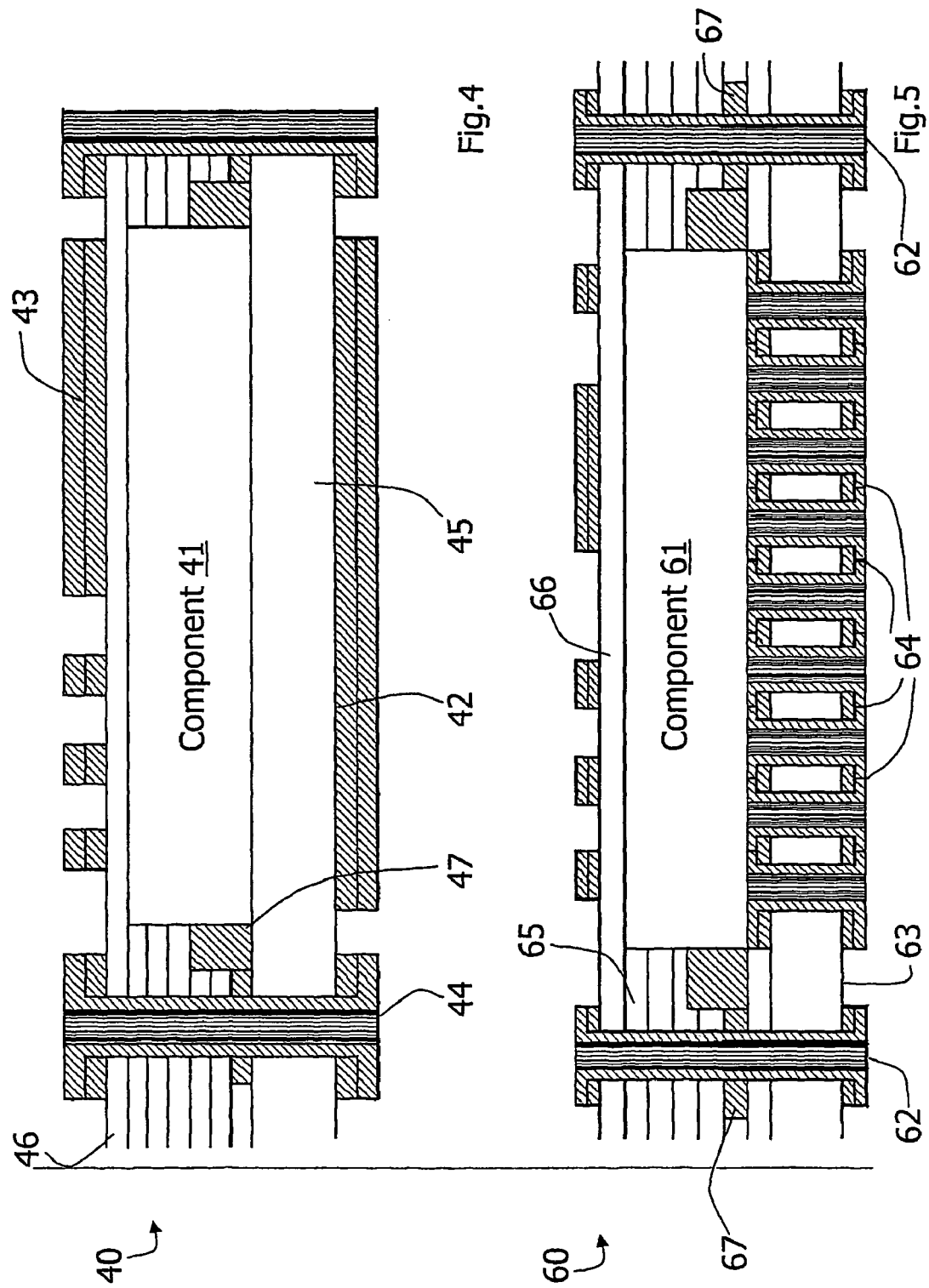

ELECTRONICS CIRCUIT MANUFACTURE

This is a continuation of PCT/IE03/000094 filed Jun. 19, 2003 and published in English.

INTRODUCTION

1. Field of the Invention

The invention relates to manufacture of circuits having passive components such as resistors and capacitors and/or active components such as transistors and integrated circuits either packaged or unpackaged (die form).

2. Prior Art Discussion

U.S. Pat. No. 6,400,573 B1 (Texas Instruments Inc.) pertains to packaging of semiconductor components and more particularly to packaging of multiple semiconductor die in a laminated substrate with an interconnect layer formed in a deposited overlay structure. Cavities of specific depths are made in the upper surface of a polymer substrate to accommodate integrated circuit chips such that the top surface of the chip and the top surface of the substrate are coplanar. A layer of laminate film is then disposed on top of the die and substrate surfaces with via openings. The via openings are disposed such that they expose bonding pads on the die surface. A conductor pattern is disposed on the laminate film so as to extend between at least some of the via openings and provide electrical connections to the bonding pads. Subsequent layers of high density interconnect (HDI) are then applied. A disadvantage of this technique is the complexity of forming the cavities to the required dimensions. Also, it appears that the die are not completely encapsulated as voids exist in the cavities after the die have been placed because the cavities are slightly larger than the die that are placed in them.

U.S. Pat. No. 6,403,881 B1 (Elliot Industries Ltd) relates to an electronic component package assembly and method of manufacturing the same. An electronic component package assembly is produced in the form of a panel. A planar base substrate, a frame layer made from laminate material with a number of cavities is attached to the planar base substrate. A component is attached to the planar base substrate in each of the cavities and a lid fits over the cavity. The component in the cavity may or may not be enclosed in a protective material.

U.S. Pat. No. 6,344,688 B1 (Singapore Institute of Microelectronics) relates to a multi-chip package for active and/or passive devices. The devices are joined to a flexible tape which is then joined to a substrate having a cavity such that the devices are within the cavity. The flexible tape has a number of interconnect pads and test pads. These are connected to the chips by electrodes or within the flexible tape.

U.S. Pat. No. 5,564,181 (Draper Laboratory Inc.) relates to a laminated substrate assembly chips-first multichip module and a method of making it. Electronic components are thinned to a predetermined thickness and are mounted on a flat internal layer in precise positions. A mechanical spacer layer having precisely-located apertures corresponding to the component locations is applied. Spaces between the mechanical spacer layer and components may be filled during laminations by adhesive for securing the mechanical spacer layer to the bottom and top layers. A cover layer is bonded over the mechanical layer and the tops of the components. Disadvantages of this method are that the chips must be accurately thinned and the apertures made to precisely fit the chips. Also, it appears that voids may remain around components if there is insufficient excess adhesive.

EP 0611,129 B1 (Lockheed) also describes a process in which components of differing shapes and thicknesses are placed on a substrate. A mould form is placed around the components and the mould is filled over the components and the moulding material is cured at 300° C. This approach appears to allow versatility in component height difference. However, it also appears that there is little versatility in component or conductor arrangements above the components, where the moulding material has been cured.

JP06247726 describes a method for mounting semiconductor chips in which a chip die bonded to a board is coated on the periphery with an insulating material. Holes for wiring are then made in the insulation layer by means of a laser beam. The hole is filled with a conductor and a wiring pattern is formed on the surface of the insulation layer.

A paper by Towle et al. entitled "Bumpless Build-Up Layer Packaging", ASME International Mechanical Engineering Congress and Exposition, November 2001, describes a method in which a die or dice is embedded in a substrate which then has one or more build up layers formed on top. Embedding the die in the panel can be done with moulding or dispensed encapsulation material.

A paper by Ostmann et al. entitled "Chip in Polymer—the next step in miniaturization", Advancing Microelectronics, Vol 29, No. 3, May/June 2002, pp 13-15, describes the embedding thinned silicon chips in to build up layers of a printed circuit board. An aspect of this work is the thining of the silicon chips to approximately 50 μm.

The invention is therefore directed towards achieving a process for embedding a component or components with:
  improved versatility in component dimensions, avoiding need to pre-machine components; and/or
  utilisation of some conventional circuit board production equipment and techniques to mininmise lead time and cost for implementations of the method; and/or
  improved robustness of the end product; and/or
  avoidance of voids around the component.

SUMMARY OF THE INVENTION

According to the invention, there is provided a method of manufacturing a circuit comprising the steps of embedding a component between external layers and making at least one electrical connection to the component through an external layer, wherein the component is encapsulated by:
  providing an internal material around the component and between the external layers,
  causing the internal material to flow, and
  allowing the internal material to cure.

Thus, by virtue of the internal material flowing the component is completely encapsulated without voids and without need to provide components of a particular height. Another major advantage that because the component is embedded in internal material between external layers, conventional multilayer board production equipment and techniques can be used for some of the operations.

In one embodiment, the internal material is caused to flow by application of heat and external pressure on both sides.

In one embodiment, the internal material comprises a resin of the type which flows under application of heat and pressure.

In one embodiment, the internal material comprises reinforcing fibres.

In another embodiment, the internal material is applied as one or more solid sheet having an aperture for the component.

In one embodiment, the depth of the sheet or sheets is such as to leave a cavity over the component.

In one embodiment, the layer includes a dummy aperture to provide a space for excess internal material when it flows.

In one embodiment, application of the internal material and pressing takes place in a vacuum.

In one embodiment, the internal material is applied as a plurality of solid sheets, one above the other.

In one embodiment, there are a plurality of components of different heights and the sheets have apertures to accommodate heights of all of the components.

In a further embodiment, a conducting layer is applied externally before or after internal material flow.

In one embodiment, pressure and/or resin depth are dynamically monitored to ensure that the internal material does not become thinner than a target minimum thickness, being greater than the depth of the deepest component.

In one embodiment, the internal material is prepreg.

In one embodiment, an electrical connection is made to a component terminal and a conductor land on a layer by drilling a via through said layer and an insulation layer and plating the via so that the plating inter-connects the conductor land and the component terminal.

In one embodiment, a component is connected to an internal conducting layer, and the method comprises the further steps of:
  subsequently applying an outer insulation layer externally of the internal conducting layer, and
  drilling through the external insulating layer from the outside to the internal conducting layer to make a connection from the outside to the internal conducting layer.

In one embodiment, an electrical connection is made to a component lateral lead.

In one embodiment, a via is drilled through the lead.

In one embodiment, the via is laser drilled.

In one embodiment, the via is mechanically drilled.

In one embodiment, the via is drilled by acid exposure for selective removal of insulation layer material.

In one embodiment, an outer conductive laminated layer is selectively etched where vias are required and subsequent acid exposure is performed to remove underlying insulation material, remaining conductive layer acting as etch resist.

In another embodiment, the method comprises the further step of back-etching the outer conductive layer.

In one embodiment, the via is drilled by plasma etching.

In one embodiment, the via is drilled by high pressure liquid jet machining, with or without abrasives.

In one embodiment, a plurality of components are embedded in the internal material one above the other and are interconnected by a multi-layer vertical bus In one embodiment, bus interconnections are made at vias formed through the components.

In one embodiment, interconnections are made at vias formed through component terminals or bonding pads to stack at least two components with total inter-component interconnection length being only the thickness of the components and intervening layers.

In one embodiment, a via is drilled in a layer and a waveguide is mounted in the via to provide an optical connection to a component.

In one embodiment, a layer comprises a transparent portion for emission or absorption of light or other electromagnetic radiation for signal or power exchange by a component.

In one embodiment, said layer is formed to provide at least one lens.

In one embodiment, the method comprises the further step of providing a heat-transfer layer thermally connected to any external or internal part of a component.

In one embodiment, the layer is thermally connected by vias and/or by electrical connections.

In one embodiment, the heat-transfer layer is a substrate onto which the component is placed.

In one embodiment, said heat transfer layer also acts as a power plane.

In one embodiment the method comprises the further step of applying an external electromagnetic shielding layer.

In one embodiment, an external layer comprises a board etched and/or plated for interconnection of components.

In one embodiment, the internal material is powder-form epoxy, and it is flowed and attached by initially applying heat and subsequently flowed by heat and pressure.

The invention also provides a circuit whenever produced by a method as defined above.

BRIEF DESCRIPTION OF THE DRAWINGS

The invention will be more clearly understood from the following description of some embodiments thereof, given by way of example only with reference to the accompanying drawings in which:

FIG. 1 is a cross-sectional diagram showing part of a circuit of the invention, in which components are embedded within a multi-layer board type structure;

FIGS. 3 to 6 are cross-sectional diagrams of different circuits produced according to the process;

DETAILED DESCRIPTION OF THE INVENTION

DESCRIPTION OF THE EMBODIMENT

Figure 2A:
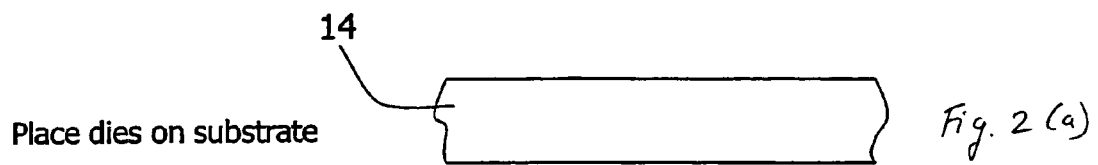
FIG. 2 is a flow diagram illustrating the production process.

Referring to FIG. 1, a circuit 1 has an SMT component 2 embedded within a multi-layer circuit having a top foil 3 and a bottom foil 4. The component 2 is connected to the remainder of the circuit by laser-drilled vias 5 and 6 which extend from the top surface, through the foil 3 and terminate at terminals at the top of the component 2. A through via 7 extends fully through the circuit 1. All of the vias are laser-drilled and electroplated using a conventional electroplating technique.

The multi-layer board comprises FR4 layers 9, 11, and 12 and circuit conductors 8 and 10 on the FR4 layers 9 and 11. The board is manufactured in the conventional manner for multi-layer circuit boards using FR4 prepreg and FR4 material. However, the manufacturing process also embeds the component 2 into the top layer 12.

Referring to FIGS. 2(a) to 2(e) the process for embedding a component (semiconductor die) is described. For clarity, the process steps are described for a simple situation in which the substrate is a single layer, and only one component is illustrated.

Figure 2B:
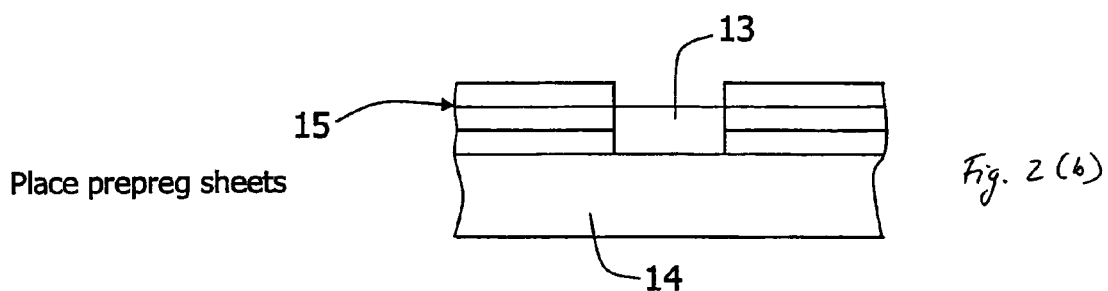

FIGS. 2(a) and 2(b).

A prepared copper-clad FR4 sheet 14 is provided and a die 13 is placed on it with an underfill of compatible adhesive. The underfill is of the type typically used when dies are bonded to a lead frame before injection moulding to produce packaged ICs, to absorb CTE differences with low loss of thermal conductivity. Since such dies have a body of, usually, silicon, and circuitry on only one side (opposite the underfill side), electrical isolation to copper and die circuitry and hence between multiple dies can be achieved through such die bodies. However, such die bodies have a relatively high thermal conductivity, allowing excellent heat dissipation. Thinning of die bodies can also be made to further enhance thermal conductivity.

The sheet 14 may be selectively etched and suitably pretreated for lamination.

Three sheets 15 of prepreg material are placed over the sheet 14. The sheets 15 have apertures through which the component 13 and other components fit freely in the X, Y, and Z directions. The sheets 15 are in this embodiment Liquid Crystal Polymer (LCP) bondsheets (prepreg) available for multilayer board production. The sheets 15 are pre-machined according to a design so that the components fit through them and the depth of the aperture is greater than the thickness of the component. Components of different thicknesses can be accommodated by pre-machining the prepreg sheets according to the design. For example, at another XY location there may be apertures in only the two lowermost or uppermost sheets 15. Some prepreg layers include dummy apertures to accommodate excess prepreg resin, as described below.

The final thickness of the compressed prepreg with all apertures exclusive of component volumes completely filled with resin is calculated at preparation stage. In calculating the aperture for a component, consideration is made for its height so that a thicker (in Z) component usually is provided with a larger aperture to be filled with resin than a thinner component, providing similar overall thinning of the prepreg through resin flow into these cavities. Extra apertures in the prepreg sheets are then added at suitable locations at this calculation stage to balance the average pressed thickness across the board. Consideration here is given to maximum resin travel distance. Press parameters such as pressure and 'temperature increase rate' are modified to adjust optimum resin travel distance. Consideration is given to ensure that the total of resin is sufficient to fill all of the cavities without allowing its thickness to reach its minimum possible, i.e. when pressure would be exerted onto the prepreg fibres instead of providing liquid pressure to fill cavities. Also, the design is such that the final pressed layer thickness exceeds the thickness of every component embedded in it. Thus, an advantage over the prior art is that large component height differences (several mms) can be accommodated. By adjusting prepreg build and aperture sizes and dummy apertures as above with suitable safety margins, there is also no risk that a die is being subjected to direct mechanical pressure in Z at any local point, potentially resulting in cracked chips. The Z press lamination pressure is hereby converted to a uniform XYZ liquid pressure only to discrete components until the resin has set. After resin has set, any further application of Z pressure will be equally distributed due to prior encapsulation.

Figure 2C:
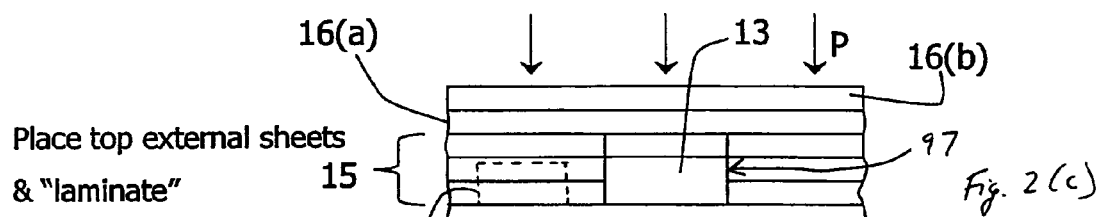
Figure 2D:
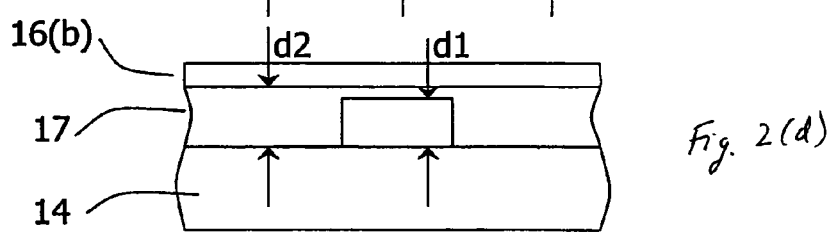

FIGS. 2(c) and 2(d).

A sheet comprising a prepreg (a LCP bondsheet is one suitable prepreg material for dies, combining absence of halogens and hermetic properties) layer 16(a) and copper foil 16(b) is placed over the prepreg layers 15. This is done leaving an empty (with negligible air) cavity or aperture 97 over each component 13. The top-most sheet may, for example, alternatively be an RCC foil. Again this is widely used in the multilayer circuit industry.

Pressure is then applied to the opposed sides of the board in conditions of applied heat and a vacuum so that the prepreg material 15 and 16(a) flows all around the components 13 to completely encapsulate them. The prepreg is then allowed to cure to provide a homogenous cured body 17. This step is analogous to the conventional lamination step for multilayer board production and can be implemented with such equipment. It is only the resin part of the prepreg which flows and then thermosets, any fibres providing mechanical and sometimes required thermal properties. The words 'complete' and 'homogenous' are herein used in relative terms, i.e. as near absolute as required depending on applied vacuum and pressure.

The internal pressure is dynamically maintained so that the resin of the prepreg flows sufficiently to completely encapsulate the components irrespective of spaces around components and differing component heights. The prepreg sheet dimensions and internal "dummy" apertures 98 are such as to avoid excessive flow of excess resin outside of the external side edges and to maintain uniform layer height and component encapsulation.

After pressing, the cured depth, d2, is greater than the maximum component thickness, d1, with a margin. This is achieved, as described above, by design of the prepreg sheets and by choice of press pressure, and temperature rise and liquid resin viscosity. In an FR4-embodiment parameters typically range from 12 to 18 bar and 2 to 4 degree/minute. A lower "kiss pressure" of some 20% of full pressure before resin melt starts is usually employed during air evacuation time (15-60 minutes) as well, especially if a large percentage of area is occupied by dies to avoid mechanical deformation of remaining prepreg and following potential damage to dies. Other materials have 'standard' times that usually needs to be adjusted accordingly from a standard multilayer press cycle with only prepreg and inner layers to bond.

During the pressing operation the (previously evacuated) spaces above (and also any voids around) the components 13 are filled with flowing resin because of countering of the mechanical pressure by a liquid pressure, preventing further collapse. Only a small volume of resin escapes at the board (panel) edges.

FIG. 2(e)

Figure 2E:
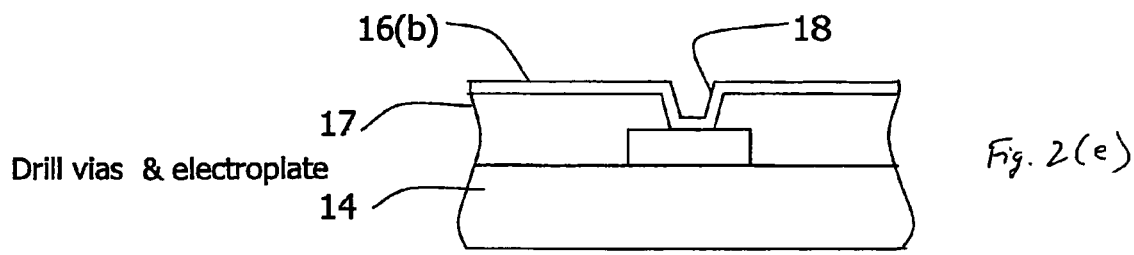

The top foil 16(b) and cured resin 16a is after lamination selectively removed (laser usually) down to points on die for connection, and these openings are electroplated to make connections to the components. A via 18 is shown in FIG. 2(e).

More complex interconnectivity may be achieved by subsequently applying more prepreg layers and foil, pressing, and making external via connections to the (now internal) foil 16(b), equivalent to standard forming of buried micro vias. The layouts for connecting tracks can be near identical for a buried die inside a pcb and the same die in a 'CSP' package attached with solder balls, without consideration for minimum solder ball pad size.

Instead of using the sheet 16(a)/16(b), one or more double-sided selectively etched boards may be used to provide connecting track layers. This is particularly advantageous if the components have many connection points, potentially reducing number of lamination cycles to one. For example, there may be a number of components each having 20×20 bond pads, and the tracks on the external sheets connect the pads to a bus.

Also, a shielding layer, for example of Cu followed by Ni, may be laminated with prepreg again on the outside(s) through further press lamination above or below all components and interconnections as required. This provides shielding and electromagnetic interference noise protection. The hence reduced noise sensitivity may also allow lower operating voltages and higher clock speeds or reduced power consumption and generated EMI noise.

In the copper sheet embodiment, instead of using an insulating substrate a thermally conductive substrate such as a sheet of thick copper may be used. This provides good heat dissipation from the components, increasing circuit life and improving reliability for most circuit designs, especially when the whole circuit side then can be directly attached to external cooling If a component is optical a via may be drilled to act as a socket for a waveguide interconnection. Also, some layers may be transparent at some or all wavelengths to allow emission or absorption of light or other electromagnetic waves for signal or power exchange of light by components, possibly with focusing. An embedding plane may be curved to provide a focusing lens.

During pressing, high vacuum in combination with the liquid pressure during resin flow ensures that there is high volume reduction of any remaining air during the encapsulation stage, providing near homogenous encapsulation.

Also, while the pressing operation is analogous to multi-layer board lamination pressing, in the invention prior to resin set there is no direct pressure applied to the components, only indirect and symmetrical pressure via the liquid flowing around the components with a depth exceeding the maximum component depth. After the resin has set, pressure is mechanical again, but totally distributed across dies through the encapsulation process. The clearance also prevents most small dust particles i.e. under or over a die or uneven die topography to exert any direct mechanical pressure on components during pressing.

An alternative to laser drilling is to use acid etching to simultaneously form vias. An outer foil is etched to a via pattern, and upon acid dipping the underlying prepreg is dissolved to the desired depth. The extent of dissolving of the prepreg may be greater than that of the foil etch, and so back-etching of the foil may be required to enlarge the foil via diameter to match that of the internal prepreg. The acid dip technique allows all vias to be simultaneously "drilled", as opposed to the sequential laser drilling method. This leads to significantly higher efficiencies and much less use of expensive laser drilling plant, when a very high number of such via holes are required.

It will be appreciated that the components are embedded using only a variation of standard manufacturing techniques used in the multi-layer circuit industry. Also, there is no need for soldered connections to the flip chip, this being achieved by use of the platings on the layers and the vias, although the embedding as per the invention of panels with components soldered to circuitry can sometimes be a feasible option. Another advantage is that there are no need for exposed components on the outside of the multilayer board, and so the circuit may be used for harsh physical and/or electrical environments and they do not need to be physically protected by a housing. Also, the invention avoids the problems arising in standard environments of dust particles reducing electrical isolation between conductors, particularly for high-density and/or high voltage circuits, and reduces possible terminal spacing in all cases when air is replaced by insulators of much greater strength. Furthermore, it is possible to place components on the outside surfaces of the board in the conventional manner, and/or on additional internal layers thus achieving a desired circuit density in a versatile manner.

Many different configurations of circuits are possible using this method and some are illustrated in FIGS. 3 to 6. Referring to FIG. 3 a circuit 20 has a flip chip 21 embedded in a multi-layer board having top and bottom foil layers 22 and 23 respectively and six additional conductor layers in-between. Vias 24 interconnect the top surface to the flip chip 21. Vias 25 interconnect the top surface to conductors on an internal foil, so that connections to the flip chip 21 are completed by a second set of vias 26. A via 27 extends between the inner foil layers on both sides. The vias 26 and 27 are "buried" vias formed after a first pressing. The "outer" vias 24 (and also any fully through-vias if there were any) are drilled after a second press cycle, after a first plating state is complete.

Referring to FIG. 4 a circuit 40 has a component 41 embedded in a board having only one substrate FR4 layer 45. Six layers of prepreg 46 are used to build up to the height of the component 41, and a seventh layer is placed over the top of the component 41 and the other layers. A through via 44 interconnects foil layers 42 and 43. In this embodiment, the vias 44 are electrically connected to lateral leads 47 of the component 41 instead of the top surfaces of the component. This is achieved by drilling through the lead 47 and subsequently electroplating. The block 41 may alternatively be a number of at least two components. In a variation of this embodiment a through-via may be used to interconnect multiple components in the Z dimensions. This may be in a bus arrangement, allowing very high frequency connectivity. The processing for connecting vias to component leads may involve back etching of epoxy to obtain dean connections, just like in standard multilayer pcb fabrication. Where there is a high density of vertically stacked components there may be at least one thermally conductive cooling layer providing a thermal path to an exposed surface.

Referring to FIG. 5 a circuit 60 has an embedded component 61 over a set of cooling vias 64 extending through an FR4 layer 63. Layers of prepreg 65 are placed over the layer 63 in which all but the topmost prepreg sheet 66 has an aperture for accommodating the components 61. In this arrangement there is a combination of underneath electrical connections made by the vias 64 and lateral electrical connections made by through vias 62 extending through component leads 67. Such cooling vias can also be drilled, usually with a drill bit with a flat tip with a drill machine equipped with depth control, into the packaged chip to the copper plate the die is attached to, from the non-die side, to provide cooling path(s) through subsequent copper plating.

Figure 6:
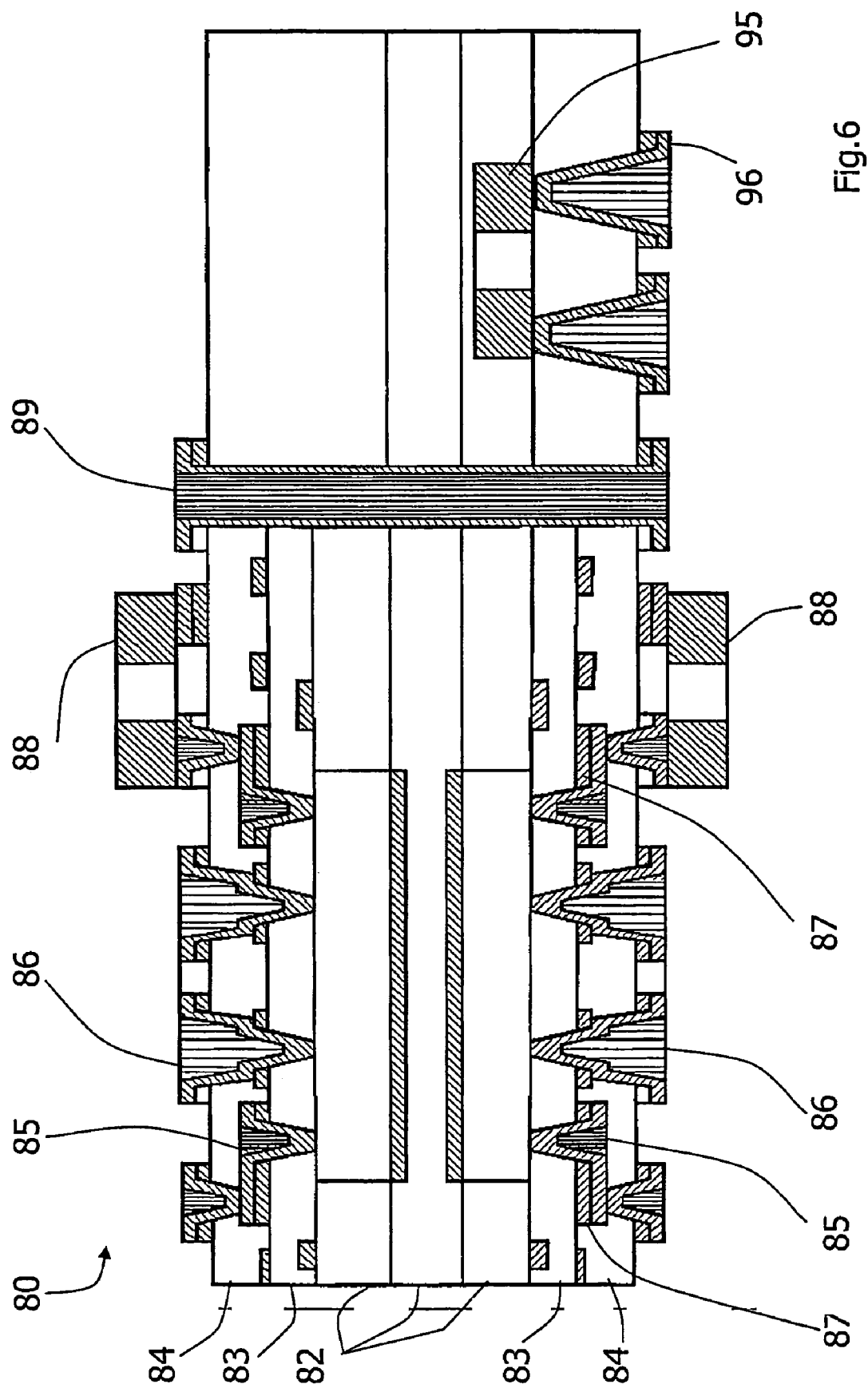

Referring to FIG. 6 a circuit 80 is produced in a symmetrical manner about an XY plane through its center The circuit is achieved in two placement cycles followed by a pressing cycle and a drilling and plating cycle on both external sides. A second press and drilling and plating cycle is required for a buried micro via 85. The items of FIG. 6 are:

81: components,
82: prepreg,
83: FR4 layers on to which 81 were placed with suitable adhesive before pressing, the prepreg layers 82 being placed around and above the coniponents 81,
85: micro vias formed after first pressing cycle encapsulating all components, then plated, then buried in a second press cycle,
84: made from prepreg in second press cycle, burying 85,
86: 'double-layer' micro via connecting outer foil with component terminal,
87: copper foil added together with 83 at first press cycle,
88: external components soldered post board manufacture in normal fashion,
89: through via, added after second lamination at same cycle as 86 and 96,
95: internal component connected at same cycle as 89 formed, and
96: connecting via to component 95.

It will be appreciated from the above that a wide variety of circuit configurations is possible using only a variation of standard multilayer board manufacturing techniques. This versatility is in terms of both the locations and types of components and the XYZ dimensions of the components. Component basic height variations are accommodated by providing an aperture in, say, six prepreg layers for a high component and in only four layers for a low component. Full advantage is then taken of the flow properties of thermosetting resins in prepreg. When the vertical lamination pressure is applied on the stack the resin in the layers is temporarily (for 1-5 mins. typically) a liquid. The prepreg layer number and thickness is chosen so that the thickness does not reach a minimum possible pressed thickness, namely that of the non-flowable fibres impregnated in the resin, and does never reach to the height of any component. Dummy apertures may be included in some prepreg layers to control flows and thickness. Determination of number, size, and locations of component and dummy apertures is according to average resin flow distance linked to its viscosity in the build-up, press cycle pressure and duration, and mechanical CAD data for the components.

Components

The components embedded according to the invention may be of any electronic or opto-electronic type such as:
- Ball grid arrays (BGAs) and CSPs without solder balls, and dies. There may be via connections to lateral terminals.
- Resistors.
- Capacitors.
- Transistors and integrated circuits.
- Thermoelectric components.

It will be appreciated that this versatility arises from the options of top, bottom, and side electrical connections and of thermal conducting layers or vias, and of any desired component height.

Internal Materials

It is not essential that prepreg be used. Any material having electrical insulation properties and being capable of reflowing (preferably but not necessarily during lamination pressing) without excessive pressure being applied to components may be used. Examples are:
- Polymers containing resins.
- High purity oxides or polymides.
- A powder epoxy which melts when the circuit/panel and/or the epoxy itself is heated and dipped into it. The coating thickness will depend on the circuit/panel temperature. Such temperature must not allow resin to more then partly cure to provide good resin flow during final pressure lamination step in which the epoxy is re-flowed under pressure. Fibres may be mixed with the epoxy for purposes of thermal conductivity and/or for strength. Thick coatings can be applied as there are no solvents in such powder.
- Glass, graphite, or aramid fibres impregnated with a reactive thermoset resin formulation or a thermoplastic resin.

Drilling

As set out above, acid exposure may be used for simultaneous formation of a large number of vias. Alternatively, plasma etching may be used. Where acid exposure or plasma etching are used, the internal material may be pre-processed to remove glass from the via locations, thus avoiding any potential barriers to the acid dipping via formation.

Advantages of the Process

The process of the invention uses a variant of a standard process for manufacturing multilayer circuit boards, and so may be easily implemented. It allows a very high component density to be achieved with excellent versatility. It also provides excellent protection for the embedded components. Another advantage is that there is no need for soldering, thus avoiding the quality problems associated with solder joints. The process may be used to completely encapsulate a circuit for use in a harsh environment, with for example external condensation. The apparent disadvantage of poor thermal dissipation can be avoided by providing thermal conduction planes and/or vias as described above. A metal layer may double as both a power plane and a heat dissipater.

In pcb fabrication standard size panels, often 18"×24" are used. These often have as many individual circuits as possible, that after manufacturing are cut up into finished units, that in themselves can be electronic components. The further processing cost of a panel of a certain layer count and complexity type after embedding is essentially the same as that of a standard multilayer panel without the components embedded. To obtain the same functions with this technology as with mounting standard discrete packages onto a panel, many times more units of the same complexity can be fitted on the same production panel, reducing overall processing cost per unit.

The invention is not limited to the embodiments described but may be varied in construction and detail; For example, when copper is used in this specification it shall be noted that although copper is the most common conductive material used, other suitable conductive materials are not excluded. When "FR4" is used herein it shall be noted that other resin systems are suitable, as set out above. Also the term 'via' should be interpreted to include blind 'microvias' and blind drilled or etched holes and through holes of any suitable size. The term "plated via" should be interpreted accordingly, although sometimes just "via" has been used for this, although the meaning is clear from the context.

The invention claimed is:

1. A method of manufacturing a circuit comprising the steps of embedding a component between external layers and making at least one electrical connection to the component through an external layer, wherein the component is encapsulated by:
   providing an internal material around the component and between the external layers,
   causing the internal material to flow, and
   allowing the internal material to cure,
   wherein the internal material is applied as one or more solid sheets having an aperture for the component, wherein the one or more solid sheets include a dummy aperture to provide a space for excess internal material when the excess internal material flows.

2. A method as claimed in claim 1, wherein the internal material is caused to flow by application of heat and external pressure on both of the external layers.

3. A method as claimed in claim 2, wherein the internal material comprises a resin of the type which flows under application of heat and pressure.

4. A method as claimed in claim 3, wherein the application of pressure takes place in a vacuum.

5. A method as claimed in claim 1, wherein the internal material comprises reinforcing fibres.

6. A method as claimed in claim 1, wherein a depth of the one or more solid sheets is such as to leave a cavity over the component.

7. A method as claimed in claim 1, wherein the internal material is applied as a plurality of solid sheets, one above the other.

8. A method as claimed in claim 7, wherein there are a plurality of components of different heights and the solid sheets have apertures to accommodate heights of all of the components.

9. A method as claimed in claim 1 wherein a conducting layer is one of the external layers, and is applied externally before or after internal material flow.

10. A method as claimed in claim 1, wherein the internal material is prepreg.

11. A method as claimed in claim 1, wherein an electrical connection is made to a component terminal of the component and a conductor land on a layers, which is one of the external layers, by drilling a via through said layer and an insulation layer and plating the via so that the plating interconnects the conductor land and the component terminal.

12. A method as claimed in claim 11, wherein the component is connected to an internal conducting layer, and the method comprises the further steps of: subsequently applying an outer insulation layer externally of the internal conducting layer, and drilling through the external insulating layer from the outside to the internal conducting layer to make a connection from the outside to the internal conducting layer.

13. A method as claimed in claim 11, wherein the via is laser drilled.

14. A method as claimed in claim 11, wherein the via is mechanically drilled.

15. A method as claimed in claim 11, wherein the via is drilled by acid exposure for selective removal of insulation layer material.

16. A method as claimed in claim 15, wherein an outer conductive laminated layer is selectively etched where vias are required and subsequent acid exposure is performed to remove underlying insulation material, remaining conductive layer acting as etch resist.

17. A method as claimed in claim 16, comprising the further step of back-etching the outer conductive layer.

18. A method as claimed in claim 11, wherein the via is drilled by plasma etching.

19. A method as claimed in claim 11, wherein the via is drilled by high pressure liquid jet machining, with or without abrasives.

20. A method as claimed in claim 1, wherein the component comprises a component lateral lead, and wherein an electrical connection is made to the component lateral lead.

21. A method as claimed in claim 1, wherein a plurality of components are embedded in the internal material one above the other and are interconnected by a multi-layer vertical bus.

22. A method as claimed in claim 1, wherein a via is drilled in a layer and a waveguide is mounted in the via to provide an optical connection to a component.

23. A method as claimed in claim 1, wherein a layer comprises a transparent portion for emission or absorption of light or other electromagnetic radiation for signal or power exchange by a component.

24. A method as claimed in claim 23, wherein said layer is formed to provide at least one lens.

25. A method as claimed in claim 1, comprising the further step of providing a heat-transfer layer thermally connected to any external or internal part of the component.

26. A method as claimed in claim 25, wherein the heat-transfer layer is thermally connected by vias and/or by electrical connections.

27. A method as claimed in claim 26, wherein said heat-transfer layer also acts as a power plane.

28. A method as claimed in claim 25, wherein the heat-transfer layer is a substrate onto which the component is placed.

29. A method as claimed in claim 1, comprising the further step of applying an external electromagnetic shielding layer to one of the external layers.

30. A method as claimed in claim 1, wherein at least one of the external layers comprises a board etched and/or plated for interconnection of components.

31. A method as claimed in claim 1, wherein the internal material is powder-form epoxy, that is flowed and attached by initially applying heat and subsequently flowed by heat and pressure.

32. A method as claimed in claim 1 wherein the component is an active component or a passive component.

33. A method of manufacturing a circuit comprising the steps of embedding a component in a plurality of components between external layers and making at least one electrical connection to the component through an external layer, wherein the component is encapsulated by:
providing an internal material around the component and between the external layers, causing the internal material to flow, and
allowing the internal material to cure, wherein the internal material is caused to flow by application of heat and external pressure on opposite sides of the internal material, wherein the pressure and/or a depth of the internal material are dynamically monitored to ensure that the internal material does not become thinner than a target minimum thickness, being greater than a component depth of a deepest component in the plurality of components, wherein the internal material is applied as one or more solid sheets having an aperture for the component, wherein the one or more solid sheets include a dummy aperture to provide a space for excess internal material when the excess internal material flows.

34. A method as claimed in claim 33 wherein the component is an active component or a passive component.

35. A method of manufacturing a circuit comprising the steps of embedding a component between external layers and making at least one electrical connection to the component through an external layer, wherein the component is encapsulated by:
providing an internal material around the component and between the external layers, causing the internal material to flow, wherein an electrical connection is made to a component lateral lead of the component, wherein a via is drilled through the lead, wherein the internal material is applied as one or more solid sheets having an aperture for the component, wherein the one or more solid sheets include a dummy aperture to provide a apace for excess internal material when the excess internal material flows.

36. A method as claimed in claim 35 wherein the component is an active component or a passive component.

37. A method of manufacturing a circuit comprising the steps of embedding a component between external layers and making at least one electrical connection to the component through an external layer, wherein the component is encapsulated by:
providing an internal material around the component and between the external layers, causing the internal material to flow, and
allowing the internal material to cure,
wherein a plurality of components are embedded in the internal material one above the other and are interconnected by a multi-layer vertical bus, and wherein bus interconnections are made at vias formed through the components, wherein the internal material is applied as one or more solid sheets having an aperture for the component, wherein the one or more solid sheets include a dummy aperture to provide a space for excess internal material when the excess internal material flows.

38. A method as claimed in claim 37, wherein interconnections are made at vias formed through component terminals of the components or bonding pads to stack at least two components with a total inter-component interconnection length being only the thickness of the components and intervening layers.

39. A method as claimed in claim 37 wherein the component is an active component or a passive component.

* * * * *

UNITED STATES PATENT AND TRADEMARK OFFICE
CERTIFICATE OF CORRECTION

PATENT NO. : 7,485,489 B2  Page 1 of 1
APPLICATION NO. : 11/012196
DATED : February 3, 2009
INVENTOR(S) : Björsell It is certified that error appears in the above-identified patent and that said Letters Patent is hereby corrected as shown below:

Title Pg. Item (76) Inventor:
Please change the Inventor's name from "BJÖRBELL" to --BJÖRSELL--.

Signed and Sealed this

Twenty-eighth Day of April, 2009

JOHN DOLL
*Acting Director of the United States Patent and Trademark Office*